(12) United States Patent
Cohen et al.

(10) Patent No.: US 7,880,438 B1
(45) Date of Patent: Feb. 1, 2011

(54) UPS BATTERY REPLACEMENT

(75) Inventors: Daniel C. Cohen, Newton, MA (US); William L. Owens, Framingham, MA (US)

(73) Assignee: American Power Conversion Corporation, West Kingston, RI (US)

( * ) Notice: Subject to any disclaimer, the term of this patent is extended or adjusted under 35 U.S.C. 154(b) by 810 days.

(21) Appl. No.: 11/759,890

(22) Filed: Jun. 7, 2007

Related U.S. Application Data

(60) Provisional application No. 60/811,835, filed on Jun. 7, 2006.

(51) Int. Cl.
H02J 7/00 (2006.01)
H02J 9/00 (2006.01)

(52) U.S. Cl. .......................... 320/132; 320/136; 307/66

(58) Field of Classification Search ................ 320/132, 320/136; 307/66, 43, 64; 230/152, 157, 230/162
See application file for complete search history.

(56) References Cited

U.S. PATENT DOCUMENTS 5,615,129 A * 3/1997 Stich et al. .................. 700/297
7,348,763 B1 * 3/2008 Reinhart et al. ............. 320/150
7,567,060 B1 * 7/2009 Atcitty et al. ............... 320/116

* cited by examiner

*Primary Examiner*—Edward Tso
*Assistant Examiner*—Richard V Muralidar
(74) *Attorney, Agent, or Firm*—Townsend and Townsend and Crew LLP

(57) ABSTRACT

An uninterruptible power supply system includes an input configured to couple to a power source, an output configured to couple to a system load, a battery, power circuitry coupled to the input, the output, and the battery, and configured to transfer power from the input to the output and to transfer power from the battery to the output, a test load, a test switch coupled to the battery and the test load and configured to selectively couple the battery to the test load, a voltage monitor coupled to the battery and configured to provide an indication of a voltage provided by the battery, and a processor coupled to the test switch and the voltage monitor and configured to effect a first partial-discharge test on the battery by actuating the test switch to couple the battery to the test load to partially discharge the battery, and by using information from the voltage monitor regarding the voltage provided by the battery at different times during the test before a complete discharge of the battery to determine a capacity of the battery.

20 Claims, 5 Drawing Sheets

UPS BATTERY REPLACEMENT

CROSS-REFERENCE TO RELATED APPLICATIONS

This application claims priority to U.S. Provisional Patent Application Ser. No. 60/811,835, filed Jun. 7, 2006, entitled "UPS Battery Replacement," which is hereby incorporated herein by reference.

BACKGROUND OF THE INVENTION

The capacities of batteries in battery-based uninterruptible power supplies (UPSs) vary depending on several factors, including temperature, age, and load. As the batteries age, they are preferably replaced once their capacities drop below desired capacities (e.g., runtimes). Preferably, the batteries are replaced before their diminished capacities affect desired operation of the UPSs, e.g., by relying on a battery with an undesirably-low runtime such that the UPS is unable to provide backup power to a load for a desired amount of time. To determine when a battery's capacity has diminished more than desired before being relied on to power a load, periodic testing may be performed on the battery.

Previously, determining a UPS's battery capacity has involved powering a load with the battery to fully discharge the battery to determine the battery's capacity. This can take a long time (e.g., 20 hours) and when the battery is significantly or completely depleted, the UPS cannot provide desired/adequate backup power.

BRIEF SUMMARY OF THE INVENTION

In general, in an aspect, the invention provides an uninterruptible power supply system including an input configured to couple to a power source, an output configured to couple to a system load, a battery, power circuitry coupled to the input, the output, and the battery, and configured to transfer power from the input to the output and to transfer power from the battery to the output, a test load, a test switch coupled to the battery and the test load and configured to selectively couple the battery to the test load, a voltage monitor coupled to the battery and configured to provide an indication of a voltage provided by the battery, and a processor coupled to the test switch and the voltage monitor and configured to effect a first partial-discharge test on the battery by actuating the test switch to couple the battery to the test load to partially discharge the battery, and by using information from the voltage monitor regarding the voltage provided by the battery at different times during the test before a complete discharge of the battery to determine a capacity of the battery.

Implementations of the invention may include one or more of the following features. The processor is configured to use first and second indications from the voltage monitor of the voltage provided by the battery at first and second, different, times before the battery is substantially discharged to determine the capacity of the battery. The second time is after the first time and is at a time from a start of the test that is about 20% of a maximum theoretical runtime given the test load for the battery voltage to reach an actual cutoff voltage. The first time is at a time from a start of the test that is about 5% of a maximum theoretical runtime given the test load for the battery voltage to reach an actual cutoff voltage. The processor is configured to determine that the battery is good if the determined battery capacity exceeds a threshold capacity. The processor is configured to effect a second partial-discharge test on the battery in response to the processor determining that the battery is bad in the first partial-discharge test, the processor being configured to use third and fourth indications from the voltage monitor of the voltage provided by the battery at third and fourth, different, times to determine the capacity of the battery, the fourth time being substantially later in time than the second time and before full discharge of the battery. The fourth time is at a time from a start of the test that is about 50% of a maximum theoretical runtime given the test load for the battery voltage to reach an actual cutoff voltage.

Implementations of the invention may include one or more of the following further features. The processor is configured to use first and second indications from the voltage monitor of the voltage provided by the battery at first and second times, and to use a linear estimation of a rate of voltage decrease between the first and second times to extrapolate future voltage decrease of the battery during the first test to determine a runtime of the battery to reach a virtual cutoff voltage associated with an actual cutoff voltage associated with the battery. The test load is effectively a fixed-resistance passive load. The system further includes a UPS housing containing the input, the output, the battery, the power circuitry, the test load, the test switch, the voltage monitor, and the processor such that the test load is internal to the UPS housing. The processor is configured to compensate for a temperature of the battery to determine the capacity of the battery.

In general, in another aspect, the invention provides a method of determining a capacity of an uninterruptible power supply system battery, the method including discharging the battery into a load for substantially less time than to fully discharge the battery using the load, determining first and second voltages provided by the battery at first and second times while discharging the battery into the load, and using the first and second voltages to make a first determination of a runtime of the battery until the voltage provided by the battery will reach an actual cutoff value associated with the battery and the load.

Implementations of the invention may include one or more of the following features. The second time is later than the first time and is about 20% of a maximum time to discharge the battery using the load such that the battery will provide the actual cutoff voltage. The method further includes determining whether the battery is bad based on the determined runtime and an acceptable runtime for the battery, and if the battery is determined to be bad, then: recharging the battery; discharging the battery into the load; determining third and fourth voltages provided by the battery at third and fourth times while discharging the battery into the load, the fourth time being later than the second time relative to a start of the discharging and before full discharge of the battery; and using the third and fourth voltages to make a second determination of the runtime of the battery until the voltage provided by the battery will reach the actual cutoff value associated with the battery and the load. The second time is later than the first time and is about 50% of a maximum time to discharge the battery using the load such that the battery will provide the actual cutoff voltage. Determining whether the battery is bad includes determining that the battery is bad if the determined runtime is less than the acceptable runtime and the acceptable runtime about 50% of a maximum runtime of the battery when powering the load until the voltage provided by the battery will reach the actual cutoff value associated with the battery and the load. The method further includes determining that the battery is bad if the voltage provided by the battery drops below a test threshold voltage during the discharging. The method further includes compensating for a temperature of the battery to make the first determination.

In general, in another aspect, the invention provides an uninterruptible power supply system including an input configured to couple to a power source; an output configured to couple to a system load; a battery; power circuitry coupled to the input, the output, and the battery, and configured to transfer power from the input to the output and to transfer power from the battery to the output; a test load; a test switch coupled to the battery and the test load and configured to selectively couple the battery to the test load; a voltage monitor coupled to the battery and configured to provide an indication of a voltage provided by the battery; and a processor coupled to the test switch and the voltage monitor and configured to effect a discharge test on the battery by actuating the test switch to couple the battery to the test load to draw power from the battery, and by using information from the voltage monitor regarding the voltage provided by the battery at different times during the discharge test to determine a capacity of the battery; where the test load is coupled to the power circuitry and comprises circuitry to limit current drawn from the battery through the test load and provided to the power circuitry to emulate a fixed resistance; and where the power circuitry is configured to combine power received from the test load and power received from the input and provide the combined power to the output.

Implementations of the invention may include one or more of the following features. The processor is configured to effect a partial-discharge test on the battery where the different times during the test are before a complete discharge of the battery.

Embodiments of the invention can provide one or more of the following capabilities. Battery capacity can be determined without completely discharging the battery. Batteries can be determined to be bad to a high degree of certainty before indicating that the battery should be replaced. One or more indications that a battery should be replaced can be provided if the battery capacity (e.g., runtime) is below a desired capacity (e.g., below a desired percent of theoretical runtime for a good battery under similar conditions). Indications of available battery runtime of a UPS can be provided. A UPS's battery capacity can be determined using a partial-discharge test. A UPS's battery capacity can be determined while providing backup power on demand. Battery capacity of a UPS can be determined without measuring current drawn from the battery. Battery capacity of a UPS can be determined while reducing variability and complexity of the determination compared to prior techniques. Experimental data can be used to help estimate runtime (actual capacity) of a battery. Failure point (or good vs. bad threshold) of a UPS battery can be set as a function of theoretical battery capacity (e.g., maximum battery capacity).

DETAILED DESCRIPTION OF THE INVENTION

Embodiments of the invention provide techniques for estimating an uninterruptible power supply (UPS) battery's capacity. The battery is periodically subjected to a partial-discharge test by using the battery to power a fixed load for a fraction of the theoretical runtime of the battery. Measurements of the battery's voltage are made at various times during the testing. Values of the measured voltage at different times during the testing are used in conjunction with information derived from experimental tests of batteries to determine an estimated capacity (e.g., runtime) available with the battery under test. If the capacity is below a desired level, or if the battery voltage drops below a threshold voltage during the testing, then further testing of the battery is preferably performed after recharging the battery. The same test can be repeated and/or another test can be performed where the battery is used to power the load for a larger fraction of the theoretical runtime of the battery. If the battery voltage drops below the threshold and/or the estimated capacity is lower than desired in the further testing, then the battery can be determined to be bad, and notifications to this effect provided, e.g., visually and/or audibly at the UPS, and/or to one or more displays connected to the UPS (e.g., through a communications network). Preferably, the techniques for determining that a battery is bad err on the side of finding the battery good, being conservative in determining that batteries are bad and should be replaced. Runtime is used as a measure of battery capacity. Other embodiments are within the scope of the invention.

Figure 1:
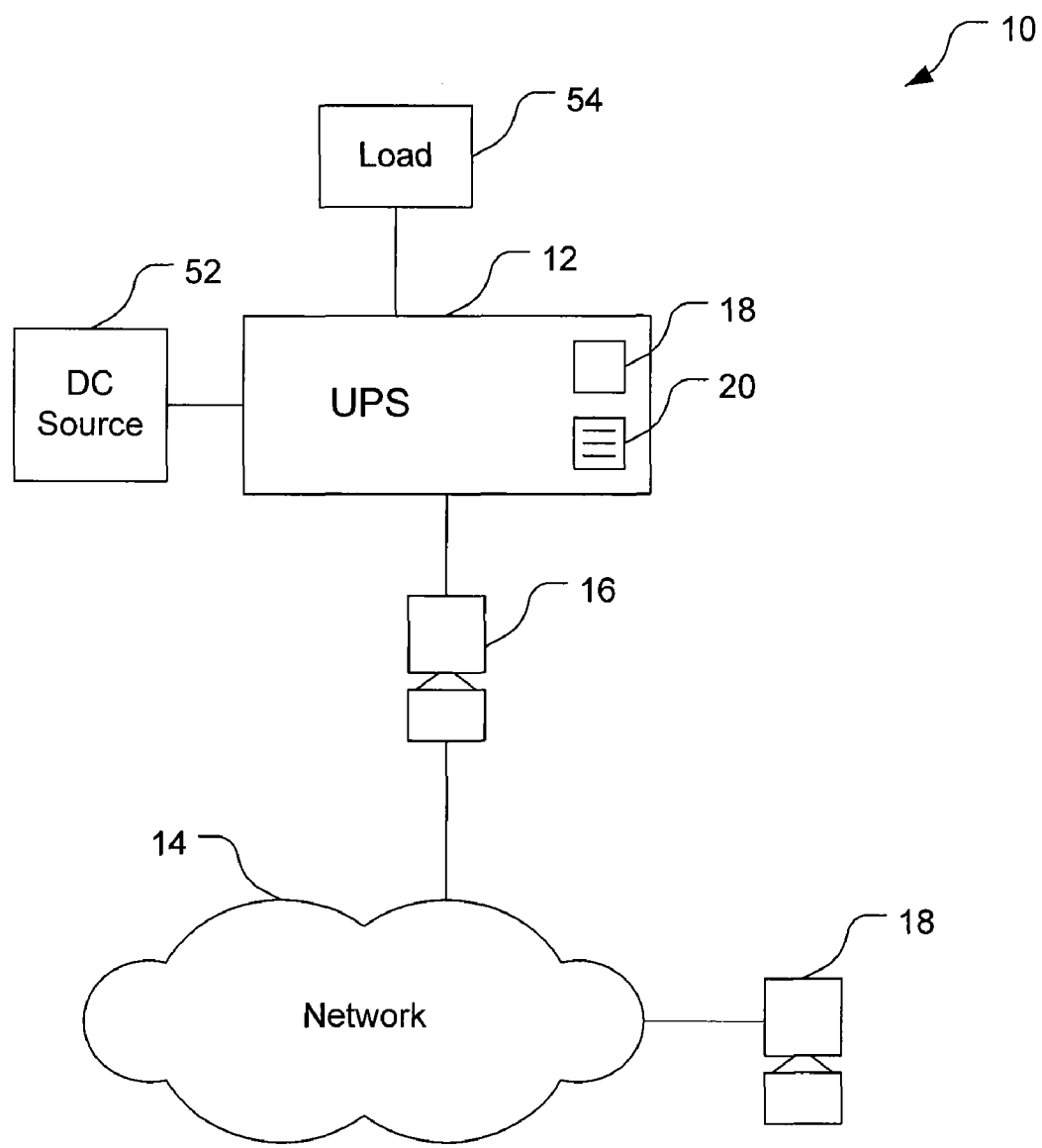
FIG. 1 is a block diagram of a networked uninterruptible power supply system.

Referring to FIG. 1, a system 10 for providing backed-up power to a load 54 and communicating power status includes a UPS 12, a network 14, a computer 16, and a computer 17. The UPS 12 is configured to supply mains power from a DC source 52, or battery power from a battery internal to the UPS 12, to the load 54. The DC source 52 can be an AC source combined with an AC/DC converter. Further, the system 10 could be configured to use an AC source with an AC/DC converter internal to the UPS 12, e.g., as part of conversion circuitry discussed below. The UPS 12 can communicate with the computer 16 (or other "intelligent load" such as telephone network equipment, e.g., FIOS Optical Network Terminal (ONT)) via discrete I/O or serial communications. The UPS 12 can provide information to the computer 16 regarding the UPS 12, e.g., capacity status of the UPS's internal battery. The capacity can be indicated as a percentage of theoretical capacity, and compared against preset limits to determine if a fault indicator or signal should be activated. The capacity can also be used to report expected runtime for a given load, e.g., in amp-hours (A-H). The UPS 12 can provide indications of a bad battery, for which replacement is recommended, through various indicators such as a visual-indicator light 18 and/or an audio-indicator speaker 20. The UPS 12 can also send information to the computer 16 indicating that the battery is bad (e.g., has lower than a desired capacity) and the computer 16 can process the received information for providing an indication at the computer 16 or to any other equipment connected to the network 14, such as head-end telephone equipment, or the computer 17.

Figure 2:
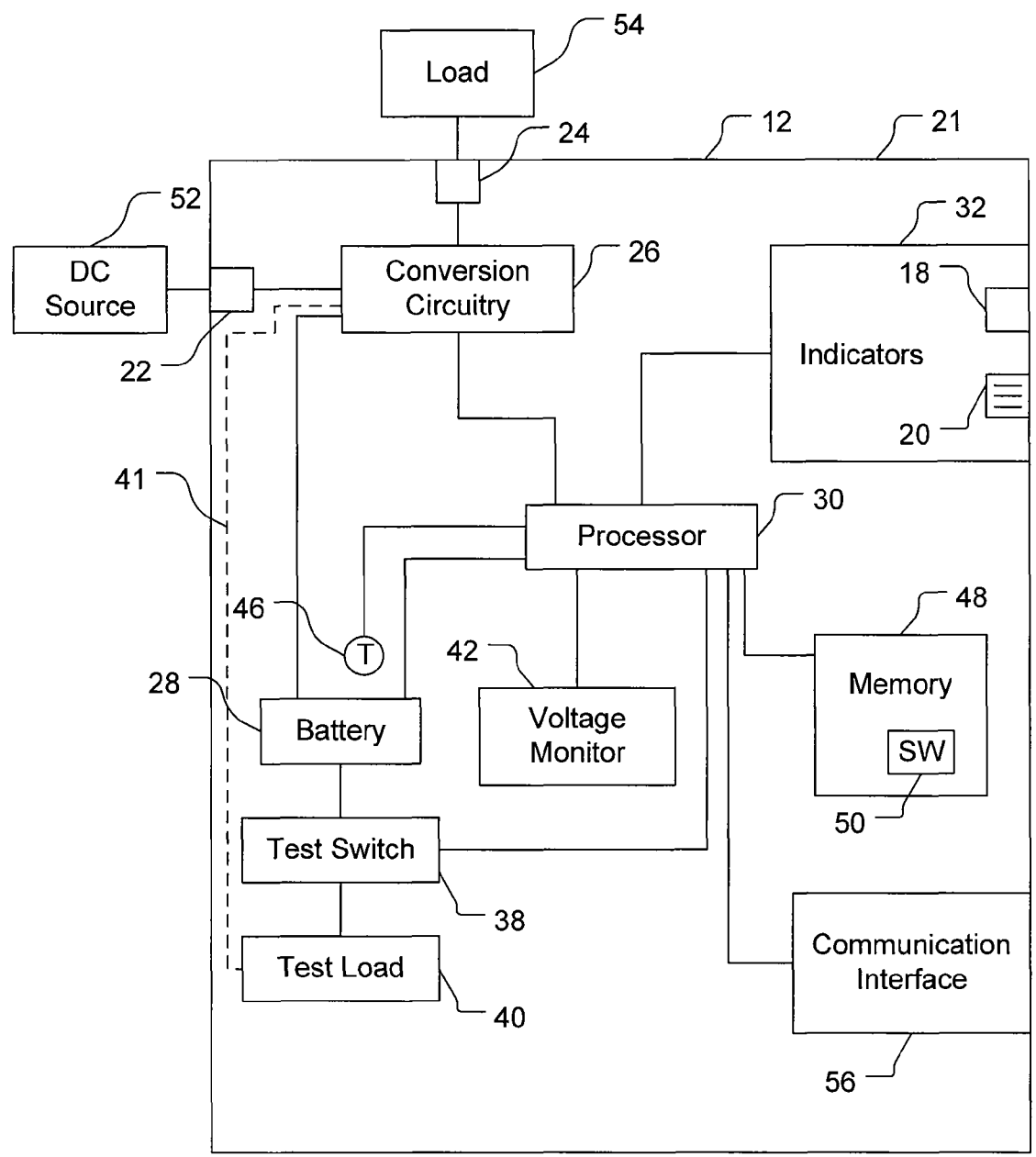
FIG. 2 is a block diagram of an uninterruptible power supply, a DC source, and a load shown in FIG. 1.

Referring also to FIG. 2, the UPS 12 includes a housing 21, a power input 22, a power output 24, power conversion circuitry 26, a battery 28, a processor 30, indicators 32 (here the light 18 and the speaker 20), a test switch 38, a test load 40, a voltage monitor 42, a temperature sensor 46, a memory 48, and a communication interface 56. The input 22 is configured to connect to the DC source 52, receive DC power, and convey the received power toward the conversion circuitry 26. The conversion circuitry 26 is configured to receive DC power from the input 22, receive DC power from the battery 28, provide a desired DC (or AC) power to the output 24, and provide charging power to the battery 28, as directed by the processor 30. The circuitry 26 may or may not alter the received energy before providing it to the output 24. The processor 30 is configured to control the conversion circuitry to regulate the source of power provided to the output 24. The output 24 is configured to connect to, and transfer power to, the load 54. The temperature sensor 46 and the voltage monitor 42 are configured to measure the temperature in the vicinity of the battery 28 and the voltage provided by the battery 28, respectively, and provide this information to the processor 30. The processor 30 is further configured to send signals to the indicators 32 to control the actuation of the light 18 and the speaker 20 to provide indications that the battery 28 is bad. The processor 30 can also exchange information between itself and the communication interface 56, e.g., indications of the capacity of the battery 28, e.g., good, bad, actual capacity, etc. The communication interface 56 is configured to connect to the computer 16 and relay signals to and from the processor 30. The switch 38 can, under control of the processor 30, selectively connect/disconnect the test load 40 to/from the battery 28. The load 40 preferably is a passive load selected such that the battery 28 will fully discharge in 20 hours when powering the load 40 alone, although other values of loads could be used. The load 40 is, here, a 33-ohm resistor.

Figure 3:
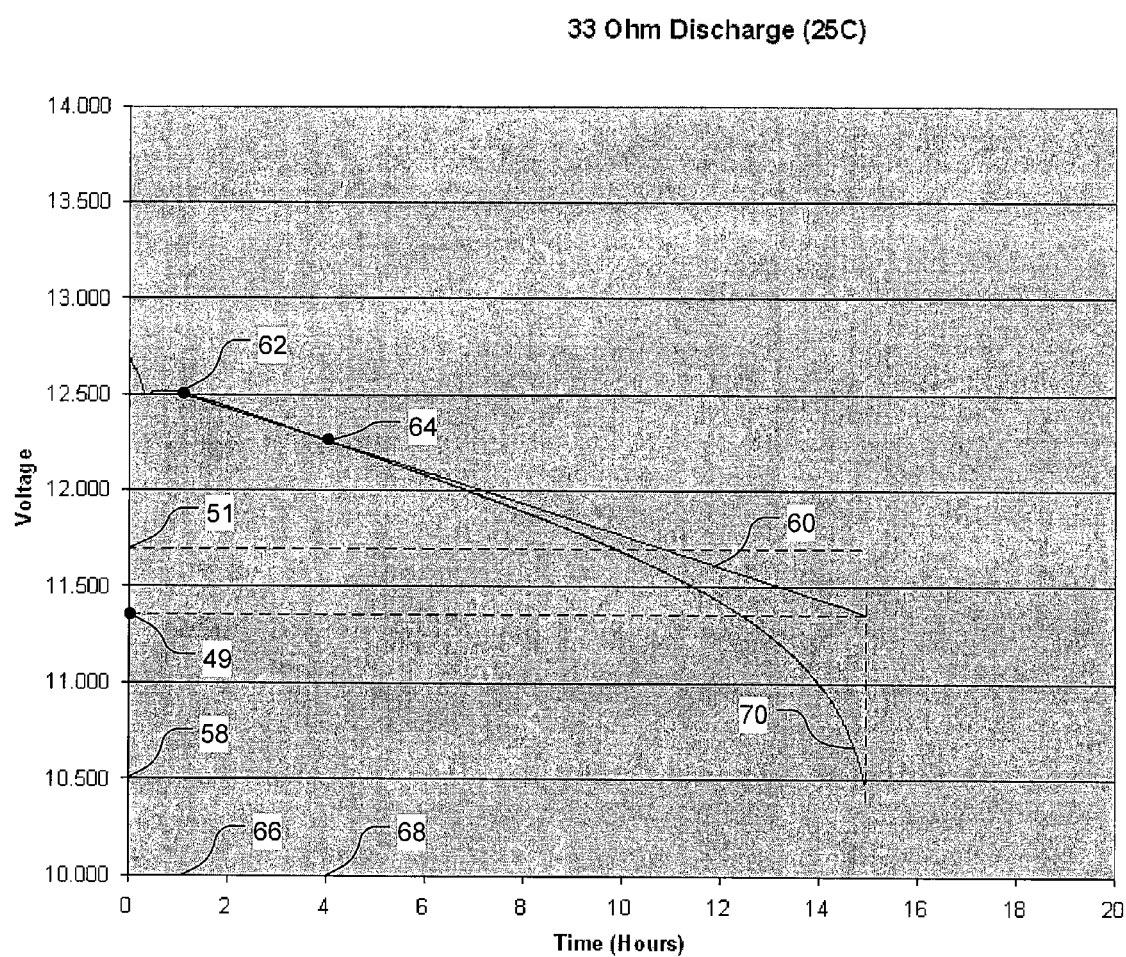
FIG. 3 is a graph of actual and predicted voltage of a battery of the uninterruptible power supply shown in FIG. 2 over time while being discharged into a 33-ohm load.
Figure 4:
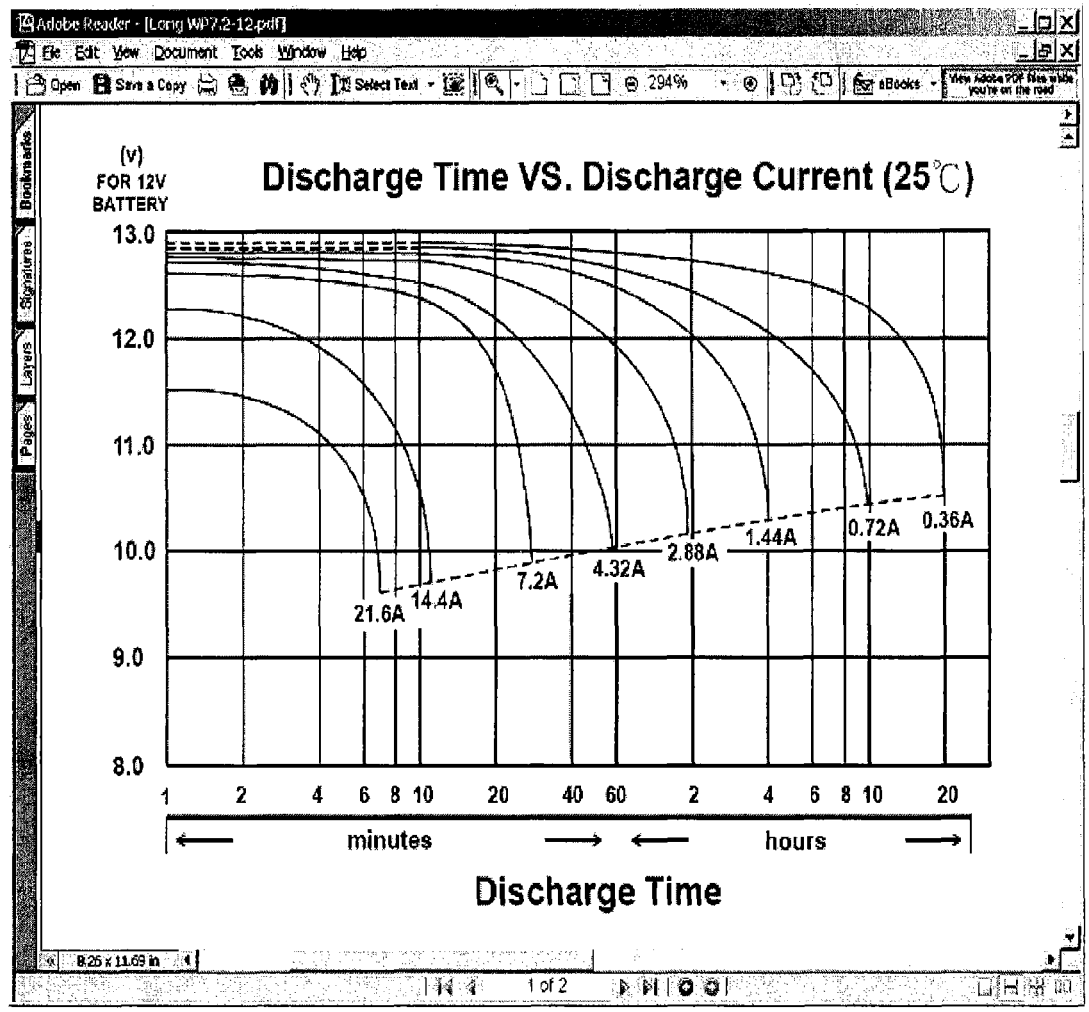
FIG. 4 is a graph of actual battery voltage plots of a battery under different loads over time.

Referring also to FIG. 3, the memory 48 stores a hypothetical end voltage value 49, that assumes a linear decrease in battery voltage, corresponding to an actual threshold end voltage value 58 in accordance with actual voltage decay as battery capacity decreases. The hypothetical end voltage value 49 is a virtual cutoff voltage and is preferably found through experiments. FIG. 3 shows a linearly decreasing voltage plot 60 based on two measured voltages 62, 64 measured at two times 66, 68 with the battery 28 powering a 33-ohm load. Here, the theoretical runtime of the battery 28 with the 33-ohm load is 20 hours, and the measurements are taken at 5% (one hour) and 20% (four hours) of the theoretical runtime of the battery 28 to full discharge when powering the load 40. The measurements could be taken at other times relative to the theoretical runtime, but the test is preferably terminated at about 20% of the theoretical runtime of the battery 28 to full discharge. The 20% end time provides good estimates of present battery capacity in a relatively short time while balancing the desire for a good estimate with the desire not to fully discharging the battery and losing potential runtime during an outage of primary power. Other durations (e.g., as a function of percent, or absolute times), however, could be used. FIG. 3 also shows a plot 70 of an actual battery voltage during discharge. Many batteries were tested and similar plots made. A voltage 58 is an actual cutoff voltage that is the end of the actual discharge of the battery 28 in accordance with the manufacturer's specifications shown in FIG. 4. A voltage 51, here 11.7 V for a 12 V/7 AH battery, was used as a minimum acceptable test threshold voltage. Various voltages could be used as the test threshold voltage 51 such as 60% of the maximum voltage of the battery 28 for a 20% of theoretical runtime discharge test, or others. As shown, the voltage value 49 of the linear plot 60 was 11.4 V when the voltage of the actual voltage plot 70 reached the minimum voltage 58, here 10.5 V. Many similar graphs were developed through testing batteries of different capacities (e.g., 3 A-H, 5 A-H, 7 A-H) at different ambient temperatures and of batteries with different ages, but all with loads for a 20-hour full discharge Through averaging of these experiments it was determined that for a 10.5 V threshold voltage, the corresponding linear plot of voltage should be at a virtual cutoff value of about 11.4 V when the battery reaches its actual cutoff voltage 58, as shown in FIG. 3. Thus, the memory 48 stores the value 49, here 11.4 V, for use in determining runtime of a battery under test using voltage measurements 62, 64 and corresponding times 66, 68 for the battery under test.

The memory 48 also stores relationships of ambient temperatures of the battery 28 and actual versus theoretical battery runtime. The relationships are stored in the memory 48 as a table, but may be stored in other forms, including as part of the software instructions 50. The relationships in the memory 48 are shown in Table 1.

TABLE 1

| Temperature | Time Compensation |
|---|---|
| >40° C. | No Testing |
| 30° C.-40° C. | 100% |
| 25° C.-30° C. | 100% |
| 20° C.-25° C. | 97.5% |
| 15° C.-20° C. | 95% |
| 10° C.-15° C. | 93.1% |
| 5° C.-10° C. | 89% |
| 0° C.-5° C. | 84% |
| −5° C.-0° C. | 78.7% (No Testing) |
| <−5° C. | No Testing |

Thus, the actual runtime of a battery at 15° C. will be about 95% of the runtime of the same battery at 25° C.

The processor 30 is configured to control the conversion circuitry 26 and the test switch 38, and to monitor the temperature and the battery voltage indicated by the sensor 46 and the monitor 42, to run battery capacity tests. The processor 30 can execute computer-readable software code instructions 50 stored on a computer-readable medium in the memory 48. The processor 30 can also track time using a clock of the processor 30, calculate data from the timing, temperature, and voltage information at various (predetermined) times (e.g., relative to the theoretical runtime of the battery 28 until full discharge), make calculations based on the measured data, and read and compare information in the memory 48 with the calculated data. In particular, the processor 30 can calculate the runtime to the 10.5 V point according to:

$$\text{runtime} = \frac{R_2 - R_E}{R_1 - R_2} \cdot (T_2 - T_1) + T_2 \qquad (1)$$

where $R_1$ and $R_2$ are the first and second voltage readings 62, 64 at the first and second times $T_1$, $T_2$, 66, 68, and $R_E$ is the voltage reading of the linear voltage plot line empirically determined to correspond to the threshold voltage of the battery 28. Here, $R_E$ is 11.4 V. The processor 30 can make runtime adjustments based on the temperature measured by the sensor 46, and the adjustments shown in Table 1, to adjust the calculated runtime as appropriate to runtime at 25° C. For example, if the runtime is calculated according to equation (1) to be 15 hours, and the measured temperature is 13° C., then the processor 30 will adjust the calculated runtime by dividing by 0.931 (as shown in Table 1, runtime at 10° C.-15° C. is 93.1% of runtime at 25° C.), thus yielding an adjusted runtime of 15/0.931=16.11 hours. The processor 30 can make a determination regarding the "health" of the battery 28 based on a comparison of the calculated/adjusted runtime and a desired runtime of the battery 28, e.g., a percentage such as 50%, 70%, etc. of the theoretical maximum runtime of the battery 28 with the load 54, and decide whether and how to proceed with further testing based on this determination in accordance with the software instructions 50.

The processor 30 can react to a failed test in multiple ways. If the battery 28 has failed the partial discharge less than three times, then the processor 30 can control the UPS 12 to recharge the battery 28 (e.g., by diverting power from the source 52 to the battery 28) and re-try the partial-discharge test to 20% of the full discharge time. If the battery 28 has failed the partial discharge three times, then the processor 30 can control the UPS 12 to recharge the battery 28 (e.g., by diverting power from the source 52 to the battery 28) and re-try the partial-discharge test to 50% of the full discharge time. If the battery 28 has failed the testing four times, then the processor 30 causes the UPS 12 to provide one or more indications that the battery 28 is bad and should be replaced, e.g., by actuating the light 18, and/or the speaker 20, and/or sending a bad-battery indication toward the computer 16 via the network 14.

The processor 30 is configured to initiate testing of the battery capacity. If power from the DC source 52 is presently not available (at least sufficiently so), then the processor 30 can delay initiation of the battery test. To initiate testing, the processor 30 causes the conversion circuitry 26 to use power from the DC source 52 to power the load 54. The processor 30 causes the switch 38 to connect the battery 28 to the test load 40.

The processor 30 preferably initiates testing of the battery 28 periodically, e.g., every 45 days (from installation and after each test). The processor 30 can maintain a running clock for the 45 days. Each time that the UPS 12 switches to battery power, the processor 30 will subtract 4.2 hours from the running clock time until the next test and the processor will store an indication of the switch to battery power in non-volatile memory. Thus, if mains power returns before the battery power is depleted, then the running clock continues. If the battery 28 is depleted such that the UPS 12 shuts down, then when the UPS 12 is repowered, the indication of the UPS 12 switching to battery power is accounted for such that the running clock for the next test will start at 44 days, 19.8 hours (or less if multiple transitions to battery power occurred, i.e., the clock starts with 45 days−4.2 hours*the number of times that the UPS 12 switched to battery power before shutting down). If the UPS 12 is started in "Last Call" mode (i.e., using alternate, extra power in addition to the battery 28), then an additional 4.2 hours is subtracted from the running clock and noted in non-volatile memory. The processor 30 could initiate testing for other reasons, e.g., with a different periodicity, and/or in response to a user command, etc.

The processor 30 is configured not to initiate battery testing under various circumstances. For example, the processor 30 will not initiate a battery test if a test-barring condition exists including (1) the temperature indicated by the sensor 46 is at or below a threshold such as 0° C. (but the processor 30 will re-try to initiate the test after a delay time, e.g., 30 hours), (2) the temperature indicated by the sensor 46 is at or above a threshold such as 35° C. (but the processor 30 will re-try to initiate the test after a delay time, e.g., 30 hours), (3) the battery 28 is not fully charged (re-try after 0.5 hours), or (4) the UPS 12 is not online (re-try after 4 hours). The processor 30 can be configured to re-try to initiate a battery test after different amounts of time than indicated.

Further, the processor 30 is configured to abort a battery test in progress under various conditions. For example, the processor 30 will preferably abort the test if a test-aborting condition occurs including (1) the power provided by the DC source 52 becomes inadequate to power the load 54 and the processor 30 connects the battery 28 to power the load 54 (with the processor 30 causing the conversion circuitry 26 to draw power from the battery 28 and the test switch 38 to disconnect the test load 40 from the battery 28) (re-try in 4 hours), (2) the temperature indicated by the sensor 46 goes below about −5° C. or above about 40° C. (re-try in 30 hours), (3) a user cancels the test with an appropriate command at the UPS 12 or transmitted to the UPS 12 (re-try in 4 hours), or (4) the battery voltage goes below the test threshold voltage (e.g., 11.7 V) (re-try after recharging the battery 28). The processor 30 can be configured to re-try to initiate a battery test after different amounts of time than indicated.

Figure 5:
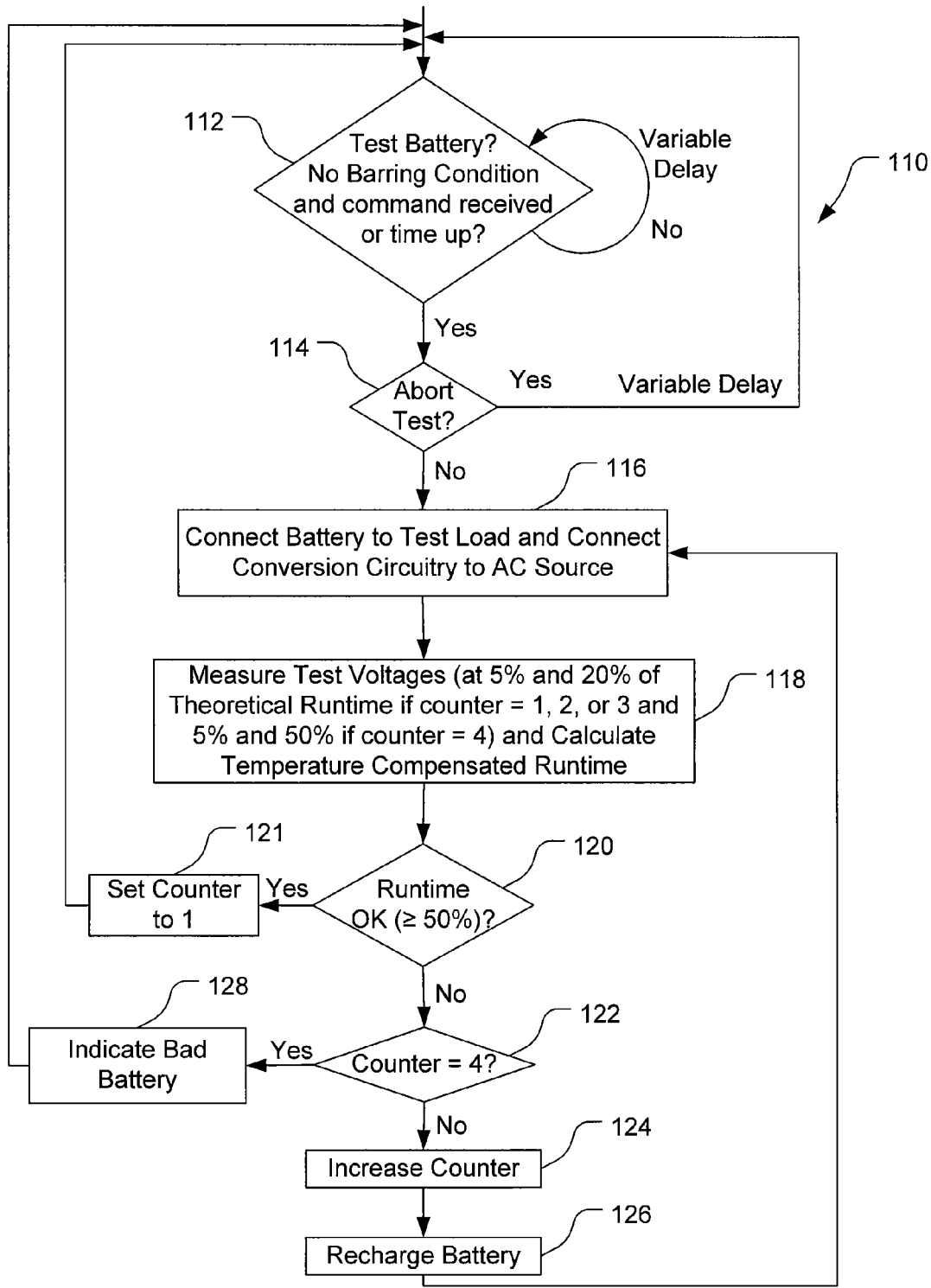
FIG. 5 is a block flow diagram of a process of determining status, and providing indications thereof, of the battery of the uninterruptible power supply shown in FIG. 2.

In operation, referring to FIG. 5, with further reference to FIGS. 1-3, a process 110 of determining health status of the battery 28, and providing indications thereof, includes the stages shown. The process 110, however, is exemplary only and not limiting. The process 110 may be altered, e.g., by having stages added, removed, or rearranged.

At stage 112, the processor 30 determines whether to run a battery test. The processor 30 responds to either a countdown clock reaching zero or a command to initiate a test being received. In response, the processor 30 determines whether any test-barring condition exists. If so, then the processor 30 waits a delay time (that may vary depending upon which of the barring conditions is (are) present)), and re-determines at stage 110 whether any barring condition exists. When there is a pending test request, and no barring condition exists, then the process 110 proceeds to stage 114.

At stage 114, an inquiry is made as to whether to abort the test. The processor 30 determines whether any of the abort-test conditions (1)-(3) listed above exist. If so, then the process 110 returns to stage 112 after a delay dependent upon the condition that exists and if not, then the process 110 proceeds to stage 116.

At stage 116, the battery test is initiated. The processor 30 controls the power conversion circuitry 26 to power the load 54 using power from the DC source 52. The processor 30 further controls the test switch 38 to connect the battery 28 to the test load 40.

At stage 118, the voltage of the battery 28 is monitored while the battery 28 is discharged through the test load 40. The monitor 42 provides indicia of the battery voltage to the processor 30. If at any time the present battery voltage, adjusted for temperature (i.e., the present voltage divided by the appropriate percentage shown in Table 1), drops below the test threshold voltage, then the process proceeds to stage 120 described below with an indication of an unacceptably low runtime (e.g., 0 hours) such that the battery 28 will be determined to be bad. Otherwise, with a battery test counter defaulted to a value of 1, the processor 30 stores the battery voltages ($R_1$, $R_2$) at 5% and 20% (i.e., $T_1$, $T_2$) of the expected runtime of the battery 28 if the battery test counter is 1, 2, or 3, and stores the battery voltages at 5% and 50% (i.e., $T_1$, $T_2$) of the expected runtime of the battery 28 if the batter test counter is 4, indicating that the battery 28 has consecutively failed its testing three previous times. Thus, the processor 30 applies a deeper discharge test if the battery 28 has failed the 20% discharge test three consecutive times. The processor 30 applies equation (1) to calculate the runtime of the battery. The threshold end voltage $R_E$ is adjusted for the temperature of the battery in accordance with Table 1 before applying equation (1).

At stage 120, it is determined whether the calculated runtime is acceptable. The processor 30 compares the calculated runtime with a desired runtime threshold, e.g., 50% of the theoretical maximum runtime of the battery 28, e.g., 50% of 20 hours runtime=10 hours. If the runtime (i.e., the present battery capacity) is acceptable, then the process resets the battery test counter to 1 at stage 121, and then the process 110 returns to stage 112 and awaits an indication to initiate a new battery test. If the runtime is unacceptable, then the process 110 proceeds to stage 122.

At stage 122, an inquiry is made as to how many battery tests have been consecutively failed. The processor 30 analyzes the battery test counter. If the counter equals 4, then the process 110 proceeds to stage 128 described below. If the counter is inequal to 4, then the process 110 proceeds to stage 124 where the battery test counter is incremented by one, after which the process 110 proceeds to stage 126.

At stage 126, the battery 28 is recharged. The processor 30 controls the power conversion circuitry to direct energy from the DC source 52 to the battery 28 until the battery 28 is recharged (the processor 30 may monitor the charge on the battery 28 or may cause the battery 28 to be charged for a set amount of time, e.g., 24 hours, that should be sufficient to fully charge the battery 28). The process 110 returns to stage 116 for further battery testing.

At stage 128, the status of the battery 28 is indicated as being bad. Thus, the process 110 will cause an indication of a bad battery if the battery 28 has reached a specified percentage, here 50%, of the battery's theoretical runtime (capacity). The processor 30 actuates the light 18 continuously until reset. The processor 30 also actuates the speaker 20 to provide a short audible indication of a bad battery, e.g., a five-second tone. After the initial tone, the processor 30 preferably periodically (e.g., every five minutes), actuates the speaker with a short tone, e.g., 0.2 seconds long. The processor 30 can also sends signals to the network 14 bound for the computer 16 that can be processed by the computer 16 to provide indications at the computer 16 that the battery 28 is bad and should be replaced.

If at any time during the process 110, a test aborting condition occurs, the processor 30 will abort the test. The processor 30 will wait a delay time (that may vary depending upon the particular test aborting condition that occurred), and then retry the battery test. Preferably, the processor 30 does not reset the battery test counter upon occurrence of a test aborting condition.

Other embodiments are within the scope of the invention. For example, the threshold end voltage $R_E$ can be adjusted for temperature (e.g., for use in equation (1) or for aborting a battery test as a test aborting threshold) in ways other than as shown in Table 1. For example, the voltage can be adjusted by 1.2% for every degree that the battery temperature is below 25° C. for a 20-hour test rate or 0.6% for every degree that the battery temperature is below 25° C. for a 40-hour test rate. Further, while the techniques described above are preferably used with a UPS that has a light load on the battery and has an expected runtime in amp-hours close to the rating of the battery, the techniques may be applied to batteries with heavier loads and/or runtimes significantly different than the ratings of the batteries. Other discharge rates for battery testing can be used, such as a 40-hour full discharge rate using a 68-ohm load as the test load. Further, while the decision regarding aborting a battery test was shown and described as being a stage within the process 110, this determination can be made at various times and/or in various ways, e.g., periodically according to a timer regardless of the present portion of the process 110 being performed, or as part of a separate thread operating within the processor 30 or another processor with the abort decision being performed constantly or periodically, or using other techniques. Further still, while the load 40 was described as a resistor internal to the UPS housing 21, other forms of a test load may be used. For example, the load 40 could comprise circuitry to regulate current drawn from the battery 28 to simulate or emulate a fixed load. The load 40 would preferably limit the current drawn from the battery to an amount essentially guaranteed to be drawn by the load 54, e.g., 350 mA for a UPS with an expected load of 750 mA for home use with a 12 V, 7 A/H battery. The current will be directed to the conversion circuitry 26 as indicated by a line 41 in FIG. 2 connecting the load 40 to the circuitry 26. The circuitry 26 would be configured to combine the power received from the source 52 and the battery 28 under control of the processor 30, which would effect the combination during battery testing. The load 40 would effectively be a virtual fixed portion of the load 54, which is typically active/varying, providing a fixed load external to the UPS 12, thus avoiding heat creation if a fixed resistor is used internal to the UPS 12.

Further, while the description above refers to the invention, more than one invention may be described.

What is claimed is:

1. An uninterruptible power supply system comprising:
an input configured to couple to a power source;
an output configured to couple to a system load;
a battery;
power circuitry coupled to the input, the output, and the battery, and configured to transfer power from the input to the output and to transfer power from the battery to the output;
a test load;
a test switch coupled to the battery and the test load and configured to selectively couple the battery to the test load;
a voltage monitor coupled to the battery and configured to provide an indication of a voltage provided by the battery; and
a processor coupled to the test switch and the voltage monitor and configured to effect a first partial-discharge test on the battery by actuating the test switch to couple the battery to the test load to partially discharge the battery, and by using information from the voltage monitor regarding the voltage provided by the battery at different times during the test before a complete discharge of the battery to determine a capacity of the battery, wherein the processor is configured to use first and second indications from the voltage monitor of the voltage provided by the battery at first and second times, and to use a voltage decrease between the first and second times to extrapolate a future voltage decrease of the battery to determine a predicted runtime of the battery to reach a virtual cutoff voltage associated with an actual cutoff voltage associated with the battery.

2. The system of claim 1 wherein the processor is configured to use first and second indications from the voltage monitor of the voltage provided by the battery at first and second, different, times before the battery is substantially discharged to determine the capacity of the battery.

3. The system of claim 2 wherein the second time is after the first time and is at a time from a start of the test that is about 20% of a maximum theoretical runtime given the test load for the battery voltage to reach an actual cutoff voltage.

4. The system of claim 2 wherein the first time is at a time from a start of the test that is about 5% of a maximum theoretical runtime given the test load for the battery voltage to reach an actual cutoff voltage.

5. The system of claim 2 wherein the processor is configured to determine that the battery is good if the determined battery capacity exceeds a threshold capacity.

6. The system of claim 5 wherein the processor is configured to effect a second partial-discharge test on the battery in response to the processor determining that the battery is bad in the first partial-discharge test, the processor being configured to use third and fourth indications from the voltage monitor of the voltage provided by the battery at third and fourth, different, times to determine the capacity of the battery, the fourth time being substantially later in time than the second time and before full discharge of the battery.

7. The system of claim 6 wherein the fourth time is at a time from a start of the test that is about 50% of a maximum theoretical runtime given the test load for the battery voltage to reach an actual cutoff voltage.

8. The system of claim 1 wherein the processor is configured to use a linear estimation of a rate of voltage decrease between the first and second times to extrapolate the future voltage decrease of the battery to determine the predicted runtime of the battery to reach the virtual cutoff voltage associated with the actual cutoff voltage associated with the battery.

9. The system of claim 1 wherein the test load is effectively a fixed-resistance passive load.

10. The system of claim 1 further comprising a UPS housing containing the input, the output, the battery, the power circuitry, the test load, the test switch, the voltage monitor, and the processor such that the test load is internal to the UPS housing.

11. The system of claim 1 wherein the processor is configured to compensate for a temperature of the battery to determine the capacity of the battery.

12. A method of determining a capacity of an uninterruptible power supply system battery, the method comprising:
  discharging the battery into a load for substantially less time than to fully discharge the battery using the load;
  determining first and second voltages provided by the battery at first and second times while discharging the battery into the load; and
  using the first and second voltages to extrapolate a future voltage decrease of the battery to make a first determination of a predicted runtime of the battery to reach a virtual cutoff voltage until the voltage provided by the battery will reach an actual cutoff value associated with the battery and the load.

13. The method of claim 12 wherein the second time is later than the first time and is about 20% of a maximum time to discharge the battery using the load such that the battery will provide the actual cutoff voltage.

14. The method of claim 12 further comprising determining whether the battery is bad based on the determined runtime and an acceptable runtime for the battery, and if the battery is determined to be bad, then:
  recharging the battery;
  discharging the battery into the load;
  determining third and fourth voltages provided by the battery at third and fourth times while discharging the battery into the load, the fourth time being later than the second time relative to a start of the discharging and before full discharge of the battery; and
  using the third and fourth voltages to make a second determination of the runtime of the battery until the voltage provided by the battery will reach the actual cutoff value associated with the battery and the load.

15. The method of claim 14 wherein the second time is later than the first time and is about 50% of a maximum time to discharge the battery using the load such that the battery will provide the actual cutoff voltage.

16. The method of claim 14 wherein determining whether the battery is bad comprises determining that the battery is bad if the determined runtime is less than the acceptable runtime and the acceptable runtime about 50% of a maximum runtime of the battery when powering the load until the voltage provided by the battery will reach the actual cutoff value associated with the battery and the load.

17. The method of claim 12 further comprising determining that the battery is bad if the voltage provided by the battery drops below a test threshold voltage during the discharging.

18. The method of claim 12 further comprising compensating for a temperature of the battery to make the first determination.

19. An uninterruptible power supply system comprising:
  an input configured to couple to a power source;
  an output configured to couple to a system load;
  a battery;
  power circuitry coupled to the input, the output, and the battery, and configured to transfer power from the input to the output and to transfer power from the battery to the output;
  a test load;
  a test switch coupled to the battery and the test load and configured to selectively couple the battery to the test load;
  a voltage monitor coupled to the battery and configured to provide an indication of a voltage provided by the battery; and
  a processor coupled to the test switch and the voltage monitor and configured to effect a discharge test on the battery by actuating the test switch to couple the battery to the test load to draw power from the battery, and by using information from the voltage monitor regarding the voltage provided by the battery at different times during the discharge test to determine a capacity of the battery;
  wherein the test load is coupled to the power circuitry and comprises circuitry to limit current drawn from the battery through the test load and provided to the power circuitry to emulate a fixed resistance; and
  wherein the power circuitry is configured to combine power received from the test load and power received from the input and provide the combined power to the output.

20. The system of claim 19 wherein the processor is configured to effect a partial-discharge test on the battery where the different times during the test are before a complete discharge of the battery.

* * * * *